United States Patent [19]
Sekine et al.

[11] Patent Number: 5,103,192
[45] Date of Patent: Apr. 7, 1992

[54] PHASE-DIFFERENCE DETECTING CIRCUIT AND METHOD OF REDUCING POWER CONSUMPTION IN A PLL SYSTEM

[75] Inventors: Shinichi Sekine, Kawasaki; Fumitaka Asami, Kunitachi; Yukinori Kamizono, Kawasaki, all of Japan

[73] Assignees: Fujitsu Limited, Kanagawa; Kyushu Fujitsu Electronics Limited, Kagoshima, both of Japan

[21] Appl. No.: 534,618

[22] Filed: Jun. 6, 1990

[30] Foreign Application Priority Data

Jun. 14, 1989 [JP] Japan .................................. 1-152901

[51] Int. Cl.⁵ .............................................. H03L 7/00
[52] U.S. Cl. ..................................... 331/1 A; 331/25; 455/76; 455/343; 328/155
[58] Field of Search ................. 331/1 A, 25; 307/514, 307/516, 525, 526, 527, 528; 328/133, 134, 155; 455/343, 76

[56] References Cited

U.S. PATENT DOCUMENTS 4,631,496 12/1986 Borras et al. ........................ 331/1 A
4,893,094 1/1990 Herold et al. ....................... 331/25 X

FOREIGN PATENT DOCUMENTS 0132196 6/1984 European Pat. Off. .
0272938 2/1987 European Pat. Off. .

OTHER PUBLICATIONS

"Handheld Telephone for 800 MHz-Band Cellular Radio Systems", J. Nakagawa et al., 37th IEEE Vehicular Technology Conference, Jun. 1-3, 1987, pp. 435-440, New York.

Primary Examiner—Robert J. Pascal
Attorney, Agent, or Firm—Armstrong, Nikaido, Marmelstein, Kubovcik & Murray

[57] ABSTRACT

A phase comparison circuit includes phase comparison device for generating an output signal corresponding to the difference in phase between a first input signal and a second input signal. The phase comparison device has an active mode, and a standby mode in which power consumption is reduced. A phase-difference detecting device is connected to the phase comparison device for outputting a control signal when the phase difference between the first and second input signals is smaller than a predetermined value. The phase comparison device is switched from the standby mode to the active mode in response to the control signal.

9 Claims, 8 Drawing Sheets

PHASE-DIFFERENCE DETECTING CIRCUIT AND METHOD OF REDUCING POWER CONSUMPTION IN A PLL SYSTEM

FIELD OF THE INVENTION

The present invention relates in genera a phase-difference detecting circuit, and in particular to such a circuit that is used in a frequency synthesizer using a PLL (phase-locked loop).

DESCRIPTION OF THE PRIOR ART

The phase-locked loop or PLL is a circuit which generates a signal corresponding in phase and frequency to an input signal, and widely used in the control of the number of revolutions of a motor (for example, audio player) and in a frequency synthesizer. When it is desired to make a frequency of oscillation stable and make a frequency variable, an oscillator of the PLL synthesizer type is eminently suited and also used in a FM transmitter.

With recent extensions in the application of PLLs, improvements in various characteristics for PLLs have been required. For example, improvements in the shortening of a lock-up time and the stability of PLLs have been required. Among frequency synthesizers using a PLL, in order to minimize power consumption of the entire circuit, there is known a frequency synthesizer which intermittently operates the PLL with two modes. The two modes comprise a standby mode in which the circuit stops and is thus in the low power consumption state, and an operating mode in which the circuit is in the operating state.

In the intermittent-operation type PLL frequency synthesizer, there are basically two methods of stopping the operation of the device. One is a method in which a power supply for circuits other than a voltage-controlled oscillator (VCO) in the PLL is turned off, the VCO input voltage is held with the time constant of a low-pass filter, and the VCO output frequency is held at a frequency nearly equal to the frequency of the lock time of the PLL. Another is a method in which a power supply for the entire PLL circuit including a VCO is turned off. In either method, it is necessary that the VCO output oscillating frequency do not largely fluctuate, when the operation of the PLL is started again by turning on the power supply.

A conventional PLL frequency synthesizer of the above type is shown, for example, in FIG. 10. In the figure, a reference oscillator 1 comprises a stable crystal oscillator and generates an original signal $X_{in}$. A reference divider 2 is programmed to divide the frequency of the original signal $X_{in}$ from the reference oscillator 1 by the number R, and produces a reference signal $f_r$ whose frequency is equal to the frequency of the original signal $X_{in}$ divided by R. A comparison divider 4 is programmed to divide the frequency of an output signal $f_{in}$ from a VCO 7 by the number N, and produces a variation signal $f_v$ whose frequency is equal to the frequency of the VCO output signal $f_{in}$ divided by N. A phase comparator 3 is a phase detecting circuit by logic, and compares the frequency and phase of the reference signal $f_r$ with the frequency and phase of the variation signal $f_v$. The phase comparator 3 outputs comparison outputs $E_U$ and $E_D$ proportional to the difference in frequency and phase between the two signals $f_r$ and $f_v$. If the reference signal $f_r$ leads the variation signal $f_v$ in phase or $f_r$ is higher in frequency than $f_v$ ($f_r > f_v$), the comparison output $E_U$ will go low for a time proportional the difference in phase between the two signals, but the comparison output $E_D$ remains high. If, on the other hand, the variation signal $f_v$ leads the reference signal $f_r$ in phase or $f_v$ is higher in frequency than $f_r$ ($f_v > f_r$), the comparison output $E_D$ will go low for a time proportional to the difference in phase between the two signals, but the comparison output $E_U$ remains high. If the phases of the reference signal $f_r$ and the variation signal $f_v$ are the same, the comparison outputs $E_U$ and $E_D$ will both go high. A charge pump 5 comprises, for example, P-channel and N-channel MOS (metal-oxide semiconductor) transistors and an inverter Based on the comparison outputs $E_U$ and $E_D$, the charge pump 5 outputs a signal that will go to the high impedance state when the comparison outputs $E_U$ and $E_D$ are both high, and outputs a signal that will go high or low when $E_U$ is low and $E_D$ is high or when $E_U$ is high and $E_D$ is low. That is, the comparison output $E_U$ or $E_D$ is low for a time proportional to the difference in phase between the two signals $f_r$ and $f_v$, so that the MOS transistors of the charge pump 5 are turned on to charge or discharge the output lines. By such a function, an error voltage resulting from the phase difference between the two signals $f_r$ and $f_v$ is produced on the output of a LPF (low-pass filter) 6 connected to the charge pump 5. The VCO 7 is an oscillator whose output frequence can be easily varied by changing an externally applied voltage. If the phase of signal $f_v$ leads the phase of signal $f_r$, then the VCO oscillating frequency will be decreased until the two signals $f_r$ and $f_v$ becomes the same in phase. If the phase of signal $f_r$ leads the phase of signal $f_v$, then the VCO oscillating frequency will be increased until the two signals $f_r$ and $f_v$ becomes the same in phase.

In the PLL constructed as described above, on the output terminal of the VCO 7 is produced a signal which is in phase with the reference signal $f_r$ and has a frequency $f_{vco}$ ($=N \cdot f_r$). Therefore, if the comparison divider 4 comprises a programmable counter and the number N applied to the divider is changed to an arbitrary number by an external control signal, then a signal with a desired frequency can be produced on the VCO output terminal.

However, in the conventional phase-difference detecting circuit having a function of intermittent operation by two modes of a standby mode and an operating mode, when the circuit is alternately operated and stopped at intervals of a predetermined time, the relative phase relationship between the reference signal $f_r$ and the comparison signal $f_v$ was instable, even if the frequencies of the two signals were made the same by some method at the time the standby mode has been switched to the operating mode. That is, since changing the mode cannot make stable the levels of the flip-flops of the reference divider 2 and comparison divider 4, it cannot be predicted which time the signals $f_r$ and $f_v$ are output at. For this reason, if the circuit is operated again in a condition where the phase difference between the signals $f_r$ and $f_v$ to be supplied to the phase comparator 3 has been large, the phase comparator 3 will tend to output a very large error signal. Since in that case the PLL is operated to reduce the phase difference between the signals $f_r$ and $f_v$, the VCO output oscillating frequency $f_{vco}$ largely changes immediately after the operation of the PLL. Consequently, there is the problem that the loop takes a long time to acquire lock.

It is therefore an object of the present invention to provide an improved phase-difference detecting circuit which is used in a PLL frequency synthesizer and the like and which is capable of minimizing the change in the VCO output frequency at the start time of the PLL operation and considerably shortening the time needed to lock the loop in phase and frequency.

SUMMARY OF THE INVENTION

In accordance with one important aspect of the present invention, there is provided a phase comparison circuit comprising phase comparison device for generating an output signal corresponding to the difference in phase between a first input signal and a second input signal, the phase comparison device having an active mode, and a standby mode in which power consumption is reduced; a phase-difference detecting device is connected to the phase comparison device for outputting a control signal when the phase difference between the first and second input signals is smaller than a predetermined value. The phase comparison device is switched from the standby mode to the active mode in response to the control signal.

In accordance with another important aspect of the present invention, there is provided a semiconductor integrated circuit device comprising phase comparison device for generating an output signal corresponding to the difference in phase between a first external input signal and a second external input signal, the phase comparison device having an active mode, and a standby mode in which power consumption is reduced; a phase-difference detecting device is connected to the phase comparison device for outputting a control signal a) when an external power save control signal indicates the switching from the standby mode to the active mode and b) when the phase difference between the external first and second input signals is smaller than a predetermined value. The phase comparison device is switched from the standby mode to the active mode in response to the control signal.

In accordance with another important aspect of the present invention, there is provided an intermittent-operation type phase-locked loop system comprising a phase-locked loop circuit for generating an output signal synchronizing in phase with a reference signal, the phase-locked loop circuit having an active mode and a standby mode in which power consumption is reduced, and the phase-locked loop circuit being switched from the active mode to the standby mode in response to a power save control signal a phase-difference detecting circuit is connected to the phase-locked loop circuit for outputting a control signal when the power save control signal is released and when a phase difference between the reference signal and the output signal is smaller than a predetermined value. The phase-locked loop circuit is switched from the standby mode to the active mode in response to the control signal.

In accordance with another important aspect of the present invention, there is provided a method of reducing the power consumption of a phase-locked loop system, comprising the steps of comparing the phase of a first signal with the phase of a second signal; reducing the power consumption by forcing a part of the phase-locked loop system to a standby state; detecting the difference in phase between the first and second signals; and switching the power reducing step to the phase comparing step when the phase difference is smaller than a predetermined value.

In accordance with another important aspect of the present invention, there is provided a phase comparison circuit comprising a hold device for holding logic levels of two different frequency input signals a signal output device for outputs a signal informing that there is substantially no phase difference between the two signals, when the two signals held by the hold device rise or fall within a predetermined range.

In accordance with another important aspect of the present invention, there is provided a phase comparison circuit comprising a first flip-flop having a data input terminal to which a first signal with a first frequency is input and a clock input terminal to which a second signal with a second frequency is input. A delay device delays the second signal by a predetermined delay. A second flip-flop has a data input terminal to which the first signal is input and a clock input terminal to which an output of the delay device is input. A logic device to which the first signal, an output of the first flip-flop, and an output of the second flip-flop are. When and when the first flip-flop output and the second flip-flop output rise or fall within a predetermined range, a signal for informing that there is substantially no phase difference between the two outputs is output by the logic device.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENT

Figure 1:
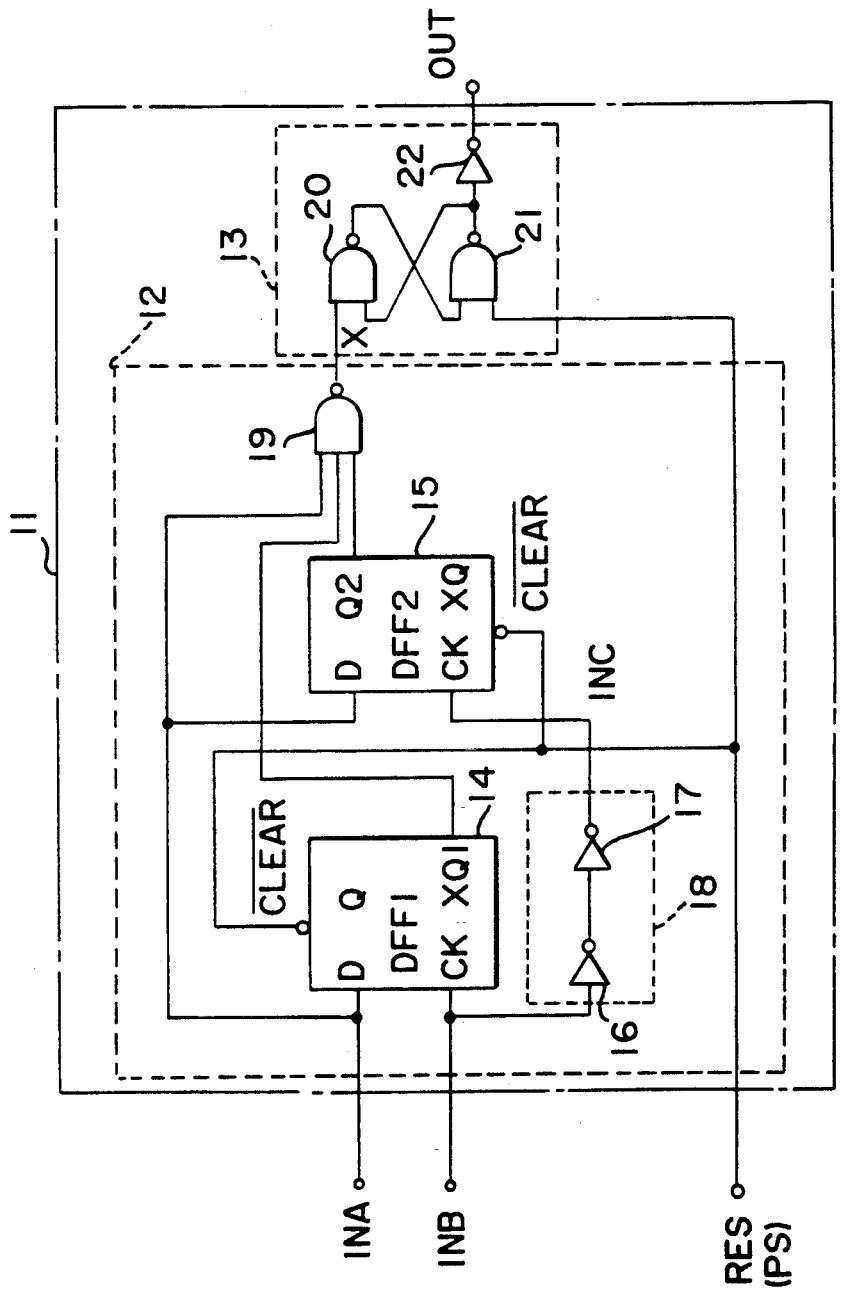
FIG. 1 is a block diagram showing the structure of a phase-difference detecting circuit in accordance with the present invention.

Referring to FIG. 1, there is shown a preferred embodiment of a phase-difference detecting circuit 11 in accordance with the present invention. The phase-difference detecting circuit 11 comprises a phase-difference detecting part 12 for detecting a phase difference between a first signal INA with a first frequency and a second signal INB with a second frequency, and a latching part 13 for latching an output of the phase-difference detecting part 12 and outputting it as an output "OUT" of the phase-difference detecting circuit 11.

The phase-difference detecting part 12 is constituted by a first D flip-flop (DFF1) 14, a second D flip-flop (DFF2) 15, a delay circuit (delay means) 18 comprising inverters 16 and 17, and a 3-input NAND gate (logic means) 19.

The first D flip-flop (DFF1) 14 has a data terminal D to which the first signal INA different in frequency from the second signal INB is input, a clock terminal CK to which the second signal INB is input, a reset terminal to which a reset signal RES is input, and an output terminal XQ1 connected to an input terminal of the 3-input NAND gate 19. Likewise, the second D flip-flop (DFF2) 15 has a data terminal D into which the first signal INA is input, a clock terminal CK to which a third signal INC delayed from the second signal INB by a predetermined time (phase) difference dt by the delay circuit 18 is input, a reset terminal to which the reset signal RES is input, and an output terminal Q2 connected to an input terminal of the 3-input NAND gate 19. The first signal INA with a first frequency is also input to the 3-input NAND gate 19. The output X of the 3-input NAND gate 19 is output to the latching part 13, which is constituted by cross-coupled NAND gates 20, 21 and an inverter 22. The NAND gate 20 has an input terminal to which the output X of the 3-input NAND gate 19 is input, while the NAND gate 21 has an input terminal to which the reset signal RES is input. Accordingly, the same first signal INA is input to both the first flip-flop 14 and the second flip-flop 15, and the clock of the second flip-flop 15 is delayed from the clock of the first flip-flop 14 by the time difference dt between the signals INB and INC.

Figure 2:
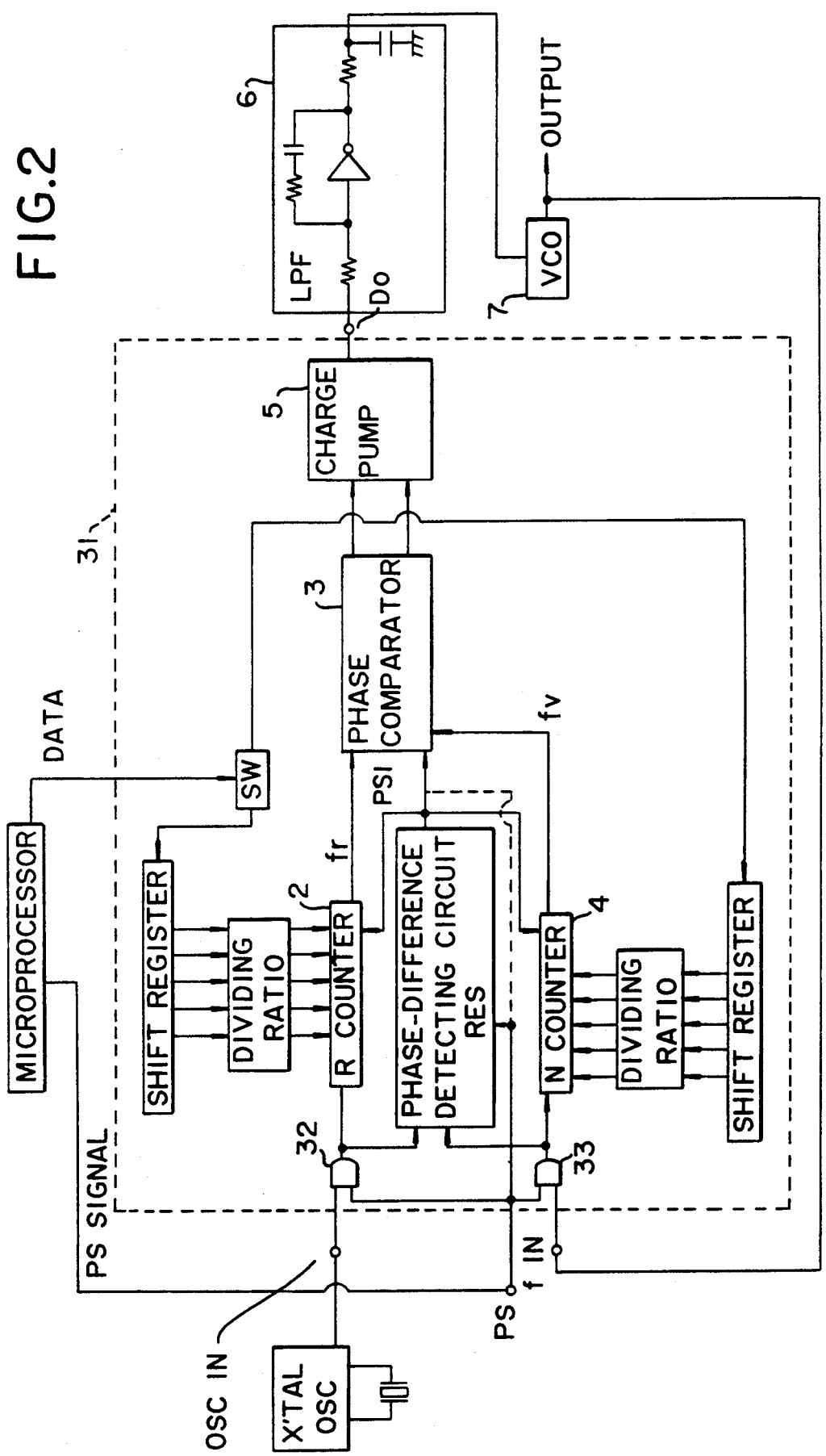
FIG. 2 is a block diagram showing a PLL frequency synthesizer to which the phase-difference detecting circuit is applied.
Figure 10:
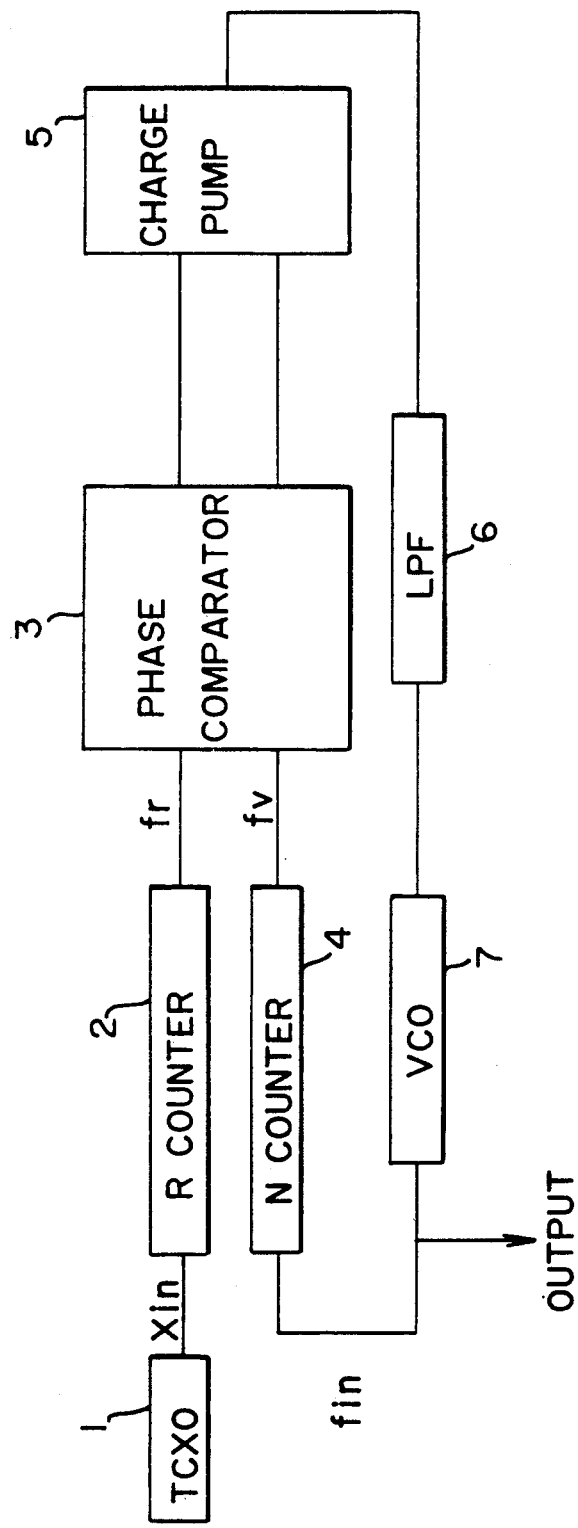
FIG. 10 is a block diagram showing the structure of a conventional PLL frequency synthesizer.

FIG. 2 schematically illustrates a PLL frequency synthesizer to which the phase-difference detecting circuit 11 is applied. The parts substantially identical to corresponding parts of FIG. 10 are designated by the same reference numerals and therefore a detailed description of the identical parts will not be given. In FIG. 2, a PLL integrated circuit (IC) 31 comprises a first AND gate 32 to which a signal $OSC_{IN}$ and a power save control signal PS respectively corresponding to the signals INA and RES of FIG. 1 are input, a second AND gate 33 to which the power save control signal PS and a signal $f_{IN}$ (corresponding to the signal INB of FIG. 1) output from a VCO are input, a programmable reference frequency divider 2 to which the output of the first AND gate 32 is input, and a programmable comparison frequency divider 4 to which the output of the second AND gate 33 is input. The outputs of the AND gates 32 and 33 and the power save control signal PS are input to a phase-difference detecting circuit 11, which detects the phase difference between the two signals $OSC_{IN}$ and $f_{IN}$ and outputs a control signal PS1 corresponding to the output (OUT) of the phase-difference detecting circuit 11 of FIG. 1 to the reference frequency divider 2 and the comparison frequency divider 4. The output $f_r$ of the reference frequency divider 2, the output $f_v$ of the comparison frequency divider 4, the power save control signal PS, and the control signal PS1 are input to a phase comparator 3. The phase comparator 3 is connected to a charge pump 5, which outputs the PLL IC output $D_o$ to a low-pass filter 6 connected to the VCO 7. Note that the standby control of the phase comparator 3 may be performed by the power save control signal PS instead of the control signal PS1, as shown by the broken line in FIG. 2. In that case, the phase comparator 3 becomes active earlier than the frequency dividers 2 and 4, but there is no problem because the frequency dividers 2 and 4 do not become active until the phases of the signals $OSC_{IN}$ and $f_{IN}$ become small.

Figure 3:
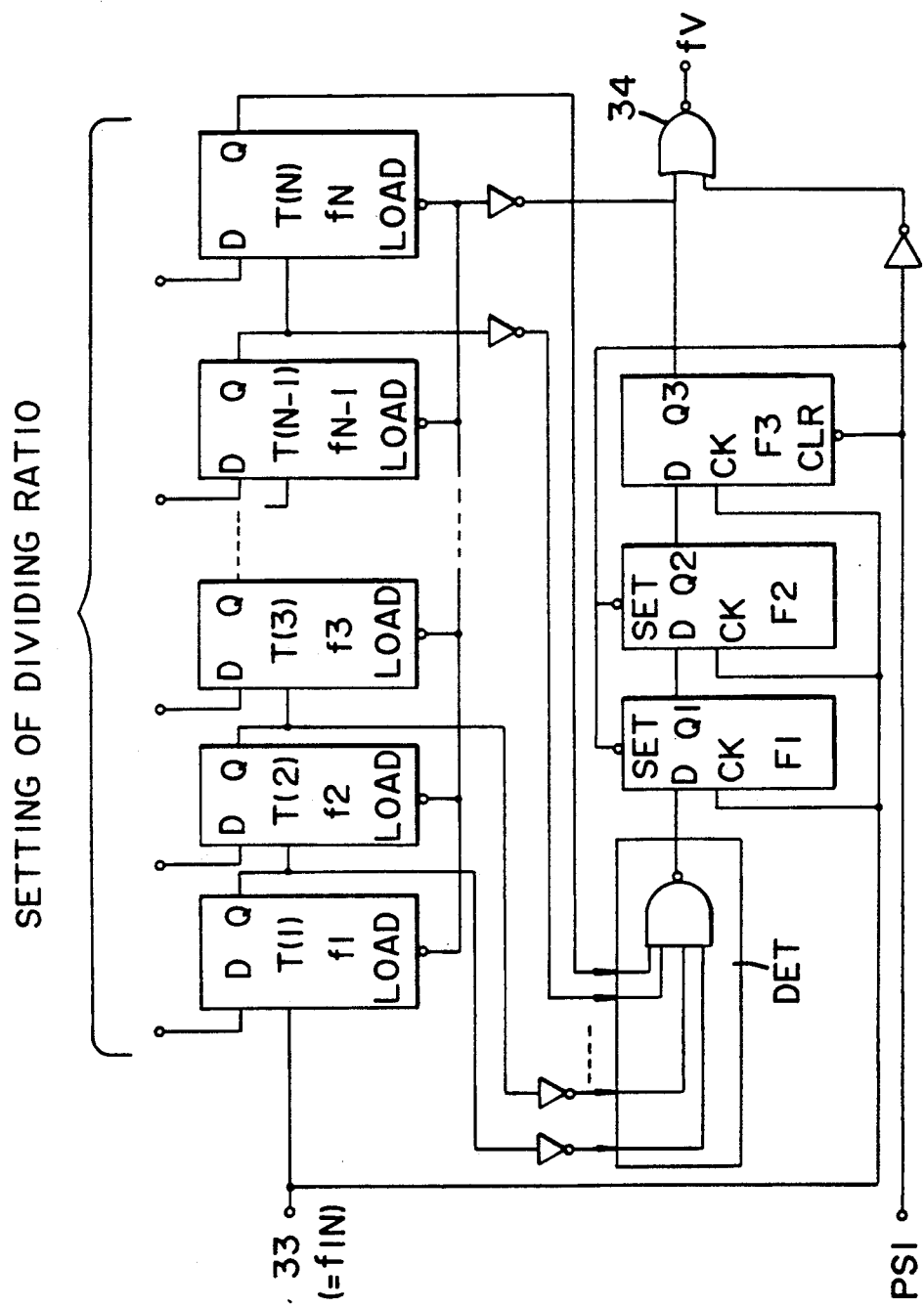
FIG. 3 schematically illustrates the structure of the divide-by-N counter of FIG. 2.

FIG. 3 schematically illustrates the structure of the divide-by-N frequency divider 4, which is substantially the same as that of the divide-by-R frequency divider 2. The output control signal PS1 from the phase-difference detecting circuit 11 goes low in the standby mode (when PS=0). If the SET terminals of a first flip-flop F1 and a second flip-flop F2 are low and the CLEAR terminal of a third flip-flop is low, then the Q1 output of the first flip-flop F1 and the Q2 output of the second flip-flop F2 go high, and the Q3 output of the third flip-flop F3 goes low. The Q3 output of the third flip-flop F3 is connected to the LOAD terminals of flip-flops f1 through fn and a NOR gate 34. The Q outputs of the flip-flops f1 through fn are connected through inverters to the inputs of a detecting circuit DET for detecting a digital value 4. The output of the circuit DET is connected to the D input of the first flip-flop F1. At the time of the load state (LOAD=low), the flip-flops f1 through fn is in the dividing-ratio data reading state, and do no go to the counting state even if the clock signal $f_{IN}$ is input. Since the two inputs of the NOR gate 34 are low and high at that time, the output $f_v$ of the frequency divider 4 goes to low. If in the active mode (when PS=1) the input signals to the frequency dividers 2 and 4 rise at the same time, the control signal PS1 will go high. As a result, the output $f_v$ goes high because the two inputs of the NOR gate 34 are both low at the time the control signal PS1 goes high, and therefore the output $f_v$ is output. If the control signal PS1 is high, the flip-flops F1, F2 and F3 are all reset, and the count will start when the clock signal $f_{IN}$ makes a low-to-high transition. If the LOAD terminals of the flip-flops f1 through fn go to high level, the flip-flops f1 through fn are all reset and the dividing operation will start Thereafter, the dividing operation is performed according to a predetermined dividing ratio.

Figure 4:
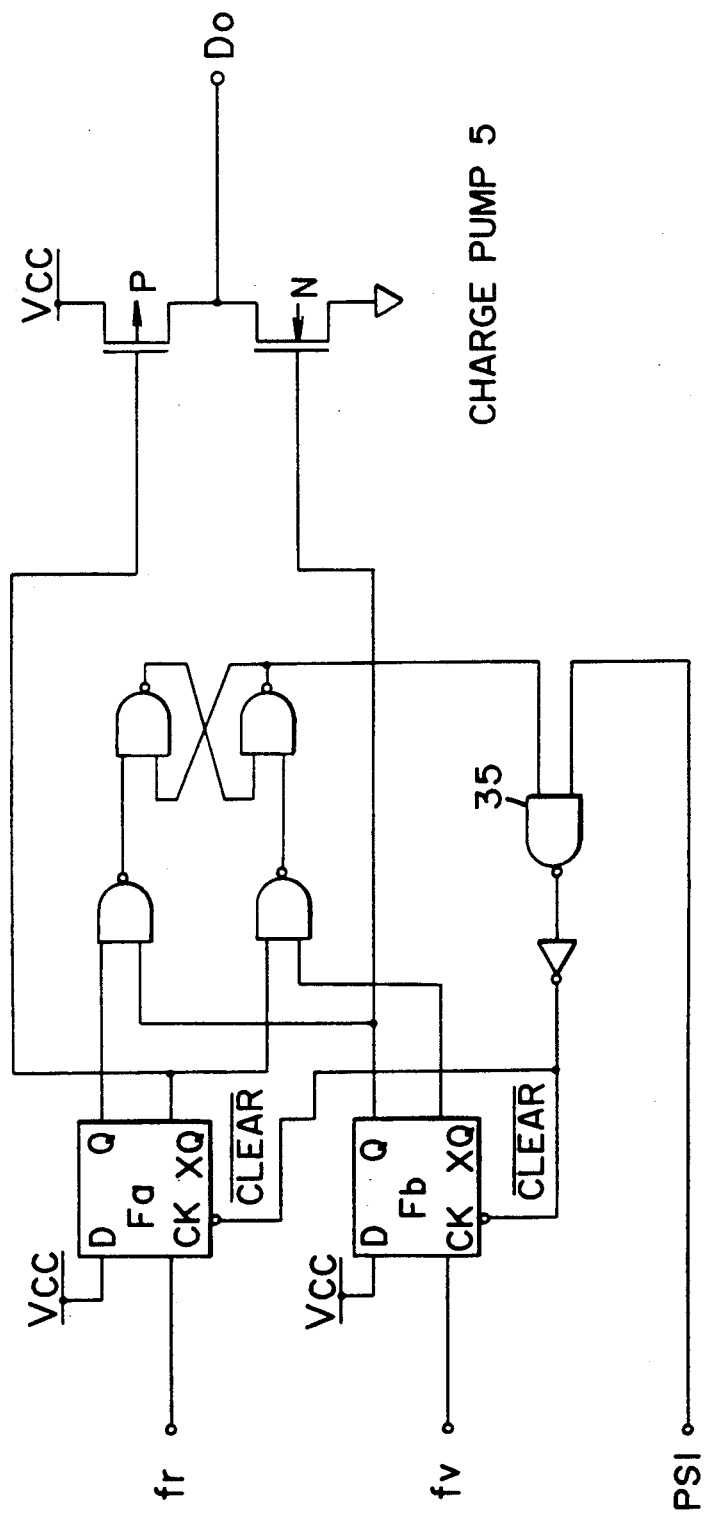
FIG. 4 schematically illustrates the structure of the phase comparator and charge pump of FIG. 2.

FIG. 4 schematically illustrates the structure of the phase comparator 3 and the charge pump 5. In the standby mode (when PS=0), the flip-flops Fa and Fb of the phase comparator 3 go to the clear state because the control signal PS1 is low. The Q output of the flip-flop Fa goes low, and the XQ output of the flip-flop Fb goes high. At this time, the P-channel and N-channel MOS transistors of the charge pump are both cut off, and the PLL IC output $D_o$ goes to the high impedance state. If the control signal PS1 goes high, then flip-flops Fa and Fb are reset (because one of the two inputs of a NAND gate 35 goes high), and the normal phase comparison operation for detecting the phase difference between the reference signal $f_r$ and the variation signal $f_v$ is performed. Note that the PLL IC output $D_o$ is held to the high impedance state until the phase comparison operation starts.

The operation will hereinafter be described.

Figure 5:
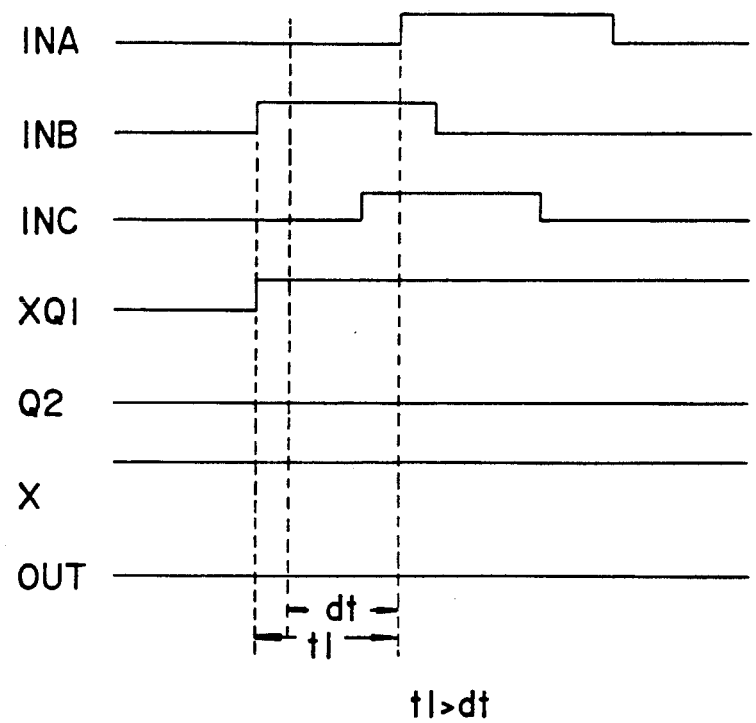
FIGS. 5 and 6 are timing diagrams showing how the phase-difference detecting circuit is operated.
Figure 6:
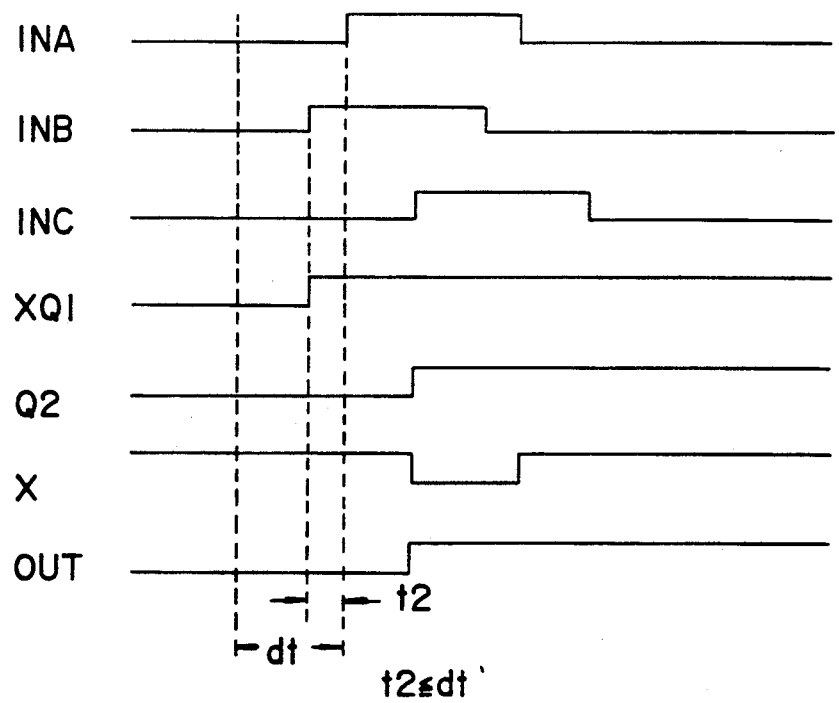

FIGS. 5 and 6 are timing diagrams showing how the phase-difference detecting circuit 11 is operated. FIG. 5 shows waveforms when the phase difference t1 between the input signals INA and INB is greater that the phase difference dt between the input signals INB and INC, while FIG. 6 shows waveforms when the phase difference t2 between the input signals INA and INB is less than the phase difference dt between the input signals INB and INC. Suppose that the signals INA and INB are different signals which are not the same in frequency and phase. If, with such a condition, the RES input is not asserted and the two signals INA and INB are input, the relationship between the two signals will go to the state shown in FIGS. 5 and 6.

Since in FIG. 5 the phase difference t1 between the two signals INA and INB is above the phase difference dt between the signals INB and INC, the XQ1 output of the D flip-flop 14 or DFF1 is low and the Q output of the D flip-flop 15 or DFF2 is high, so that the output (OUT) of the phase-difference detecting circuit 11 remains low.

If, as shown in FIG. 6, the rising edge of the signal INB leads the rising edge of the signal INA and the phase difference t2 between the two signals INA and INB is within the phase difference dt between the signals INB and INC, the XQ1 output of the DFF1 will go high because the DFF1 reads the level of the signal INA before the rising edge of the signal INA, and the Q2 output of the DFF2 will go high because the DFF2 reads the level of the signal INA after the rising edge of the signal INA. Since at this time the signal INA is high, the output X of the NAND gate 19 goes low and the output (OUT) of the detecting circuit 11 thus goes low. In this way, the state where the phase difference between the two signals INA and INB is within the phase difference dt between the signals INB and INC is detected.

Figure 7A:
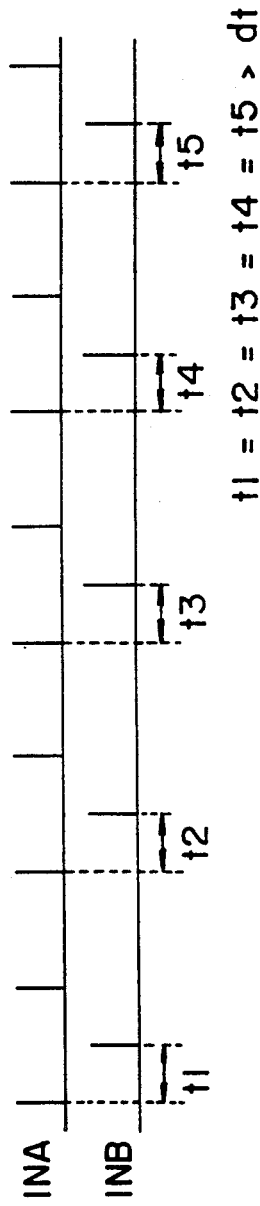
FIG. 7(a) shows a condition where the phase difference between input signals INA and INB is always above a predetermined time difference dt.
Figure 7B:
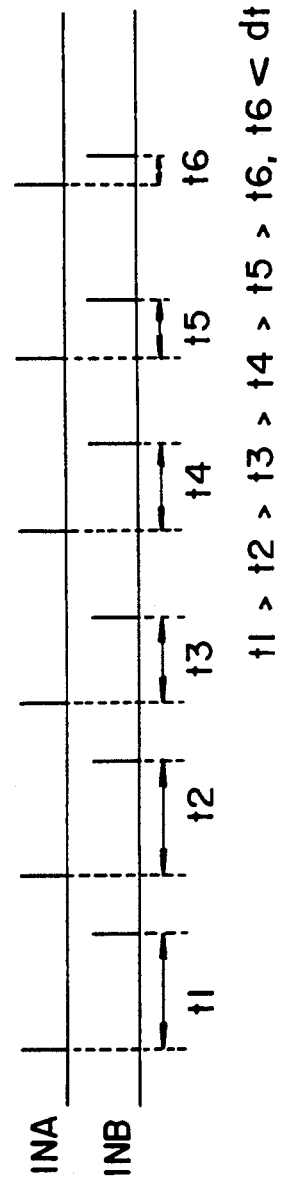
FIG. 7(b) shows a condition where the phase difference is less than the predetermined time difference dt.

If, as shown in FIG. 7(a), the frequencies of the input signals INA and INB both do not vary and the phase difference t1 is greater than dt, the PLL will not be operated because the phase difference is always above a predetermined time difference dt. In order to avoid this condition, the signals INA and INB are not the same in frequency and phase, and therefore there is a moment that a phase difference t6 becomes less than dt, as shown in FIG. 7(b). In fact, in the intermittent operation of a PLL, the charge pump output goes to the high impedance state at the standby time, and the low-pass filter can hold the output voltage when the loop is locked, by the capacity. However, the condition of FIG. 7(a) that the phase difference is always above the predetermined time difference dt cannot occur because the output voltage slightly varies due to the leak current and thus the frequency slightly varies.

Note that the phase difference dt between the signals INB and INC can be easily varied by simply increasing and decreasing the number of the inverters 16 and 17 of the delay circuit 18. The phase difference dt between the signals INB and INC is set so that the two low-to-high transitions or high-to-low transitions can quickly match depending on the frequencies of the two signals. For example, when the low-to-high transition of the signal INA does not match with the low-to-high transition of the signal INB, a larger phase difference dt is set. In the phase-difference detecting circuit 11, the low-to-high transitions of the signals INA and INB are detected at the same time. If the output (OUT) of the phase-difference detecting circuit 11 changes, it will be necessary to reset the circuit to detect the low-to-high transition after that time. The reset signal RES is therefore input to the DFF1, DFF2 and the latching part 13, as shown in FIG. 1.

Figure 8:
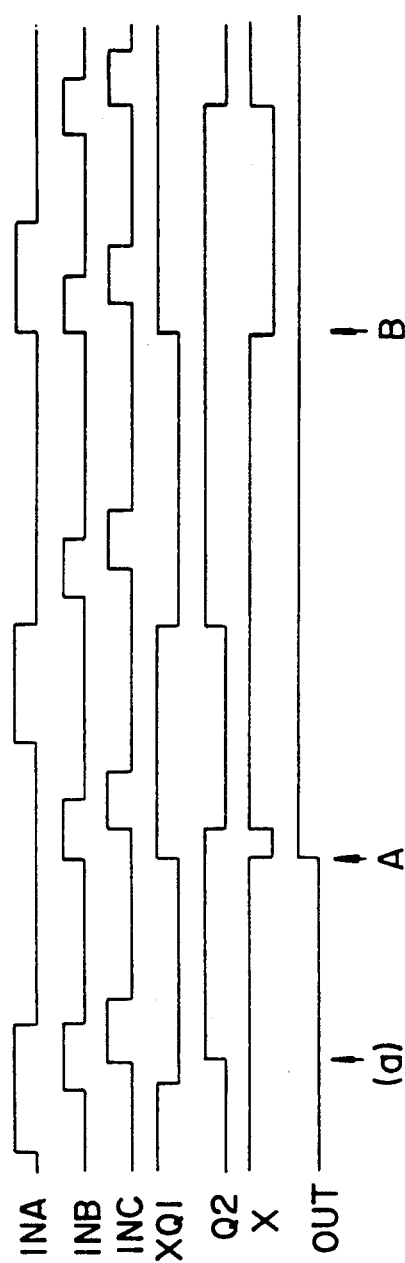
FIG. 8 is a timing diagram used to explain the reason that, besides the XQ1 output of the DFF1 and the Q2 output of the DFF2, the signal INA is inputted to the 3-input NAND gate.

In the embodiment of FIG. 1, in addition to the XQ1 output of the DFF1 and the Q2 output of the DFF2, the signal INA is input to the 3-input NAND gate 19. The reasons are as follows. That is, if the signal INA is left unconnected and only the XQ1 and Q2 outputs are connected, the output X of the circuit 11 will go low regardless of the phase difference between the signals INA and INB, as shown in the point A of FIG. 8. Consequently, the output (OUT) of the circuit 11 that is to change at the point B of FIG. 8 will change. The reason is that, when the Q2 output of the DFF2 goes high at the point (a) of FIG. 8 and at the point A the XQ1 output of the DFF1 goes high and the Q2 output goes low, the Q2 output is delayed by the phase difference dt between the signals INB and INC and therefore the output X of the NAND gate 19 goes to a low level. In the embodiment of FIG. 1, the signal INA is input to the NAND gate 19 to eliminate this incorrect operation, and the above described problem is thus overcome.

Figure 9:
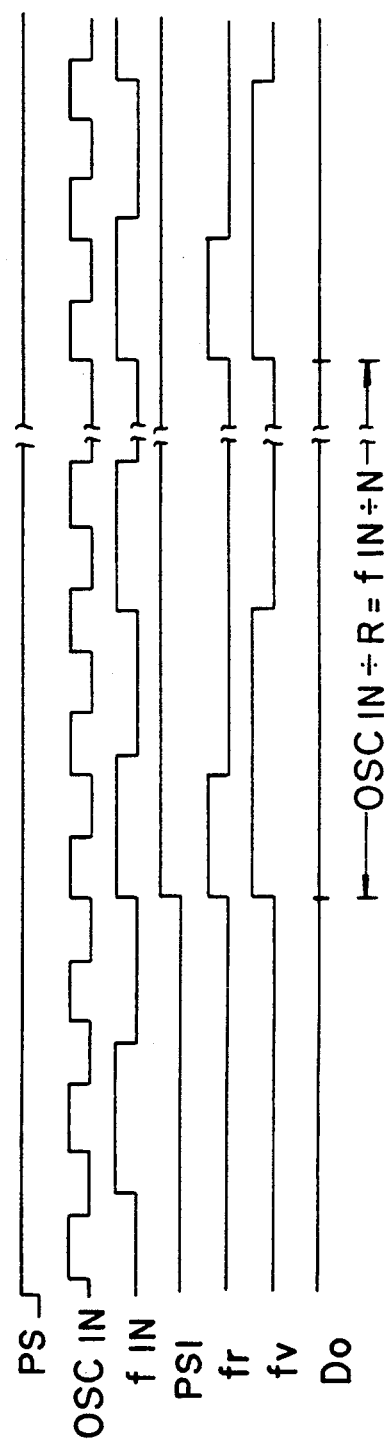
FIG. 9 is a timing diagram showing how the PLL IC of FIG. 2 is operated.

FIG. 9 shows a timing diagram when the phase-difference detecting circuit 11 is applied to the PLL IC 31. In the figure, suppose now that the PLL IC 31 is in the standby mode (PS=low). With this state, each counter goes to the reset state, the charge pump output goes to the high impedance state. Therefore, since the voltage at the time of lock is held by the CR time constant of the low-pass filter 6, the external VCO 7 ideally oscillates at a frequency $f_{IN}$ of the lock time, but in fact the VCO oscillating frequency slightly changes due to leak.

If the standby mode is switched to the operating mode, each input gate is then opened, the oscillating output of the external OSC is input by the OSC$_{IN}$ signal and enters the phase-difference detecting circuit 11. The VCO oscillating output is also input by the $f_{IN}$ signal and enters the phase-difference detecting circuit 11. If the rising edges of the two signals become the relationship of FIG. 6, then the control signal PS1 is output from the circuit 11 to the frequency dividers 2 and 4. If the frequency dividers 2 and 4 are operated at the same time as the input of the control signal PS1 to the frequency dividers 2 and 4 to output the signals $f_r$ and $f_v$ to the phase comparator 3, an error signal will become very small and thus the lock-up time can be greatly quickened.

Thus, in the present invention, the transition state where two different frequency signals go high or low at the same time with a predetermined range is detected, and at the same time the counters of the reference frequency divider 2 and comparator frequency divider 4 are operated. Therefore, if the phase-difference detecting circuit 11 according to the present invention is used, for example, in an intermittently operated PLL IC, the reference signal $f_r$ and the comparison signal $f_v$ which are the same in phase can be produced for a very short time. Consequently, the error signal can be made very small and the lock-up time is thus greatly shortened, so that the performance of the PLL synthesizer is greatly enhanced.

The invention has been described with reference to the preferred embodiment. Obviously modifications and alternations will occur to others upon a reading and understanding of this application. It is intended to include all such modifications and alternations insofar as they come within the scope of the appended claims or the equivalents thereof.

What we claim is:

1. A phase comparison circuit comprising:
   phase comparison means for generating an output signal corresponding to a difference in phase between a first input signal and a second input signal, the phase comparison means having an active mode, and standby mode in which power consumption is reduced, said phase comparison means comprises a first frequency divider for dividing said first input signal, a second frequency divider for dividing said second input signal, and a phase comparator to which an output of said first frequency divider and an output of said second frequency divider are input, each of said first and second frequency dividers having said standby mode to said active mode in response to a control signal; and phase-difference detecting means connected to said phase comparison means for outputting said control signal when the phase difference between said first and second input signals is smaller than a predetermined value;

said phase comparison means being switched from said standby mode to said active mode in response to said control signal.

2. A phase comparison circuit as set forth in claim 1, wherein said phase comparator has said active mode and standby mode, and is switched from said standby mode to said active mode in response to said control signal.

3. A phase comparison circuit as set forth in claim 1, wherein said phase-difference detecting means comprises:

a first flip-flop having a data input terminal to which said first input signal is input and a clock input terminal to which said second input signal is input;

delay means for delaying said second input signal by a predetermined delay;

a second flip-flop having a data input terminal to which said first input signal is input and a clock input terminal to which an output of said delay means is input;

logic means to which said first input signal, an output of said first flip-flop, and an output of said second flip-flop are input; and when said first flip-flop output and said second flip-flop output rise or fall within a predetermined range, a signal for informing that there is substantially no phase difference between said two outputs being output by said logic means.

4. A semiconductor interpreted circuit comprising:

phase comparison means for generating an output signal corresponding to a difference in phase between a first external input signal and a second external input signal, the phase comparison means having an active mode, and standby mode in which power consumption is reduced, said phase comparison means comprises a first frequency divider for dividing said first external input signal, a second frequency divider for dividing said second external input signal, a phase comparator to which an output of said first frequency divider and an output of said second frequency divider are input, each of said first and second frequency dividers having said active mode and standby mode and being switched from said standby mode to said active mode in response to a control signal; and phase-difference detecting means, connected to said phase comparison means, for outputting said control signal when an external power save control signal indicates switching from said standby mode to said active mode and when said phase difference between said external first and second input signals is smaller than a predetermined value;

said phase comparison means being switched from said standby mode to said active mode in response to said control signal.

5. A semiconductor integrated circuit device as set forth in claim 4, wherein said phase comparison means has said active mode and standby mode, and is switched from said standby mode to said active mode in response to said external power save control signal.

6. A semiconductor integrated circuit device as set forth in claim 4, wherein said phase comparator has said active mode and standby mode, and is switched from said standby mode to said active mode in response to said control signal.

7. A semiconductor integrated circuit device as set forth in claim 4, wherein said phase comparison means further comprises a first gate circuit having input terminals to which said first external input signal and said external power save control signal are input, and an output terminal connected to said first frequency divider; and a second gate circuit having input terminals to which second external input signal and said external power save control signal are input, and an output terminal connected to said first frequency divider;

said first and second gate circuits allowing said first and second dexternal inputs signals to pass therethrough when said external power save control signal is active, and preventing said first and second external input signals from passing therethrough when said external power save control signal is active.

8. An intermittent-operation type phase-locked loop system comprising:

a phase-locked loop circuit for generating an output signal synchronizing in phase with a reference signal, the phase-locked loop circuit having an active mode and a standby mode in which power consumption is reduced, and the phase-locked loop circuit being switched from said active mode to said standby mode in response to a power save control signal, said phase-locked loop circuit comprising a first frequency divider for dividing said reference signal, a second frequency divider for dividing said output signal, and a phase comparator to which an output of said first frequency divider and an output of said second frequency divider are input, each of said first and second frequency dividers having said active mode and said standby mode and being switched from said standby mode to said active mode in response to a control signal; and phase-difference detecting circuit connected to said loop circuit for outputting said control signal when said power save control signal is released and when a phase difference between said reference signal and said output signal is smaller than a predetermined value;

said phase-locked loop circuit being switched from said standby mode to said active mode in response to said control signal.

9. A phase comparison circuit comprising:

a first flip-flop having a data input terminal to which a first signal with a first frequency is input and a clock input terminal to which a second signal with a second frequency is input;

delay means for delaying said second signal by a predetermined delay;

a second flip-flop having a data input to which said first signal is input and a clock input terminal to which an output of said delay means is input;

logic means to which said first signal, an output of said first flip-flop, and an output of said second flip-flop are input; and when said first flip-flop output and said second flip-flop output rise or fall within a predetermined range, a signal for informing that therein is substantially no phase difference between said two outputs being output by said logic means.

* * * * *